United States Patent [19]
Rosenmayer

[11] Patent Number: 6,071,600
[45] Date of Patent: Jun. 6, 2000

[54] LOW DIELECTRIC CONSTANT MATERIAL FOR USE AS AN INSULATION ELEMENT IN AN ELECTRONIC DEVICE

[75] Inventor: C. Thomas Rosenmayer, Eau Claire, Wis.

[73] Assignee: W. L. Gore & Associates, Inc., Newark, Del.

[21] Appl. No.: 09/195,051

[22] Filed: Nov. 18, 1998

Related U.S. Application Data

[60] Division of application No. 08/919,586, Apr. 4, 1997, Pat. No. 5,889,104, which is a continuation-in-part of application No. 08/584,848, Jan. 9, 1996, abandoned
[60] Provisional application No. 60/005,759, Oct. 20, 1995.

[51] Int. Cl.[7] .................................................... B32B 7/02
[52] U.S. Cl. ........................ 428/213; 428/195; 428/212; 428/220; 428/421; 428/424.2; 428/446; 428/901
[58] Field of Search .................................. 428/195, 212, 428/213, 220, 421, 424.2, 446, 901; 156/306.6; 524/545, 546, 544

[56] References Cited

U.S. PATENT DOCUMENTS

| | | |
|---|---|---|
| 4,384,092 | 5/1983 | Blaise et al. |
| 4,824,511 | 4/1989 | Hartman ........................ 156/306.6 |

(List continued on next page.)

FOREIGN PATENT DOCUMENTS

| | | |
|---|---|---|
| 0 393 682 | 4/1990 | European Pat. Off. |
| 0 769 788 | 4/1997 | European Pat. Off. |

OTHER PUBLICATIONS

Adhesion Studies of Metals on Fluorocarbon Polymer Films—Chin–An Chang, Yong–Kil Kim, and A.G. Schrott—J. Vac. Sci. Technol. A, vol. 8, No. 4, Jul./Aug. 1990 (pp. 3304–3309).

Methods and Needs for Low K Material Research—Chiu H. Ting, Thomas E. Seidel—SEMATECH—Mat. Res. Soc. Symp. Proc. vol. 381—1995 Materials Research Society (pp. 3–17).

Teflon AF Amorphous Fluoropolymers—Technical Information—Properties of Amorphous Fluoropolymers Based on 2,2–Bistrifluoromethyl–4,5–Difluoro–1,3–Dioxole (Buck, et al., May 17, 1993 (pp. 1–11).

Low–Dielectric Constant Materials–Synthesis and Applications in Microelectronics—T.M. Lu, S.F. Murarka, T.S. Kuan, C.H. Ting—vol. 381 (pp. 45–50).

Interconnect Metallization for Future Device Generations—Bruce Roberts, Alain Harrus, Robert L. Jackson—Feb. 1995 Solid State Technology (pp. 69–78).

29th Annual Proceedings Reliability Physics 1991—IEEE Catalog No. 91CH2974–4 (pp. 52–56).

Article "Teflon AF"—Technical Information—Du Pont, May 17, 1993, pp. 1–12; Properties of Amorphous Fluoropolymers Based on 2.2 Bistrifluoremethyl–4,5–Bifluor 1,3–Xioxide.

*Primary Examiner*—William Krynski
*Assistant Examiner*—Hong J. Xu
*Attorney, Agent, or Firm*—Victor M. Genco, Jr.

[57] ABSTRACT

A low dielectric constant material is provided for use as an insulation element in an electronic device, such as but not limited to an integrated circuit structure for example. Such a low dielectric constant material may be formed from an aqueous fluoropolymer microemulsion or microdispersion. The low dielectric constant material may be made porous, further lowering its dielectric constant. The low dielectric constant material may be deposited by a spin-coating process and patterned using reactive ion etching or other suitable techniques.

13 Claims, 3 Drawing Sheets

U.S. PATENT DOCUMENTS

| | | |
|---|---|---|
| 4,935,844 | 6/1990 | Burn . |
| 4,937,132 | 6/1990 | Gaku et al. . |
| 5,034,801 | 7/1991 | Fischer . |
| 5,098,781 | 3/1992 | Minnick et al. . |
| 5,126,192 | 6/1992 | Chellis et al. . |
| 5,260,119 | 11/1993 | Jean et al. . |
| 5,283,081 | 2/1994 | Kata et al. . |
| 5,292,927 | 3/1994 | Griffith et al. . |
| 5,312,716 | 5/1994 | Unoki et al. . |
| 5,324,813 | 6/1994 | Hougham et al. . |
| 5,358,775 | 10/1994 | Horn, III . |
| 5,359,767 | 11/1994 | Chen et al. . |
| 5,362,550 | 11/1994 | Takeshita . |
| 5,393,712 | 2/1995 | Rostoker et al. . |
| 5,399,640 | 3/1995 | Hazlebeck . |
| 5,402,003 | 3/1995 | McIver et al. . |
| 5,403,900 | 4/1995 | Wu et al. . |
| 5,405,677 | 4/1995 | Griffith et al. . |
| 5,438,022 | 8/1995 | Allman et al. . |
| 5,442,237 | 8/1995 | Hughes et al. . |
| 5,449,427 | 9/1995 | Wojnarowski et al. . |
| 5,591,676 | 1/1997 | Hughes et al. . |
| 5,889,104 | 3/1999 | Rosenmayer .......................... 524/545 |

LOW DIELECTRIC CONSTANT MATERIAL FOR USE AS AN INSULATION ELEMENT IN AN ELECTRONIC DEVICE

CROSS REFERENCE TO RELATED APPLICATIONS

The present application is a divisional of U.S. patent application Ser. No. 08/919,586 filed Apr. 4, 1997, allowed, as U.S. Pat. No. 5,889,104 which is a continuation-in-part of U.S. patent application Ser. No. 08/584,848 filed Jan. 9, 1996, abandoned, which claims the benefit of Provisional Application No. 60/005,759, filed Oct. 20, 1995.

BACKGROUND OF THE INVENTION

The present invention generally relates to high speed integrated circuits. More particularly, the present invention relates to an improved dielectric material for use as an insulation element in an electronic device, such as but not limited to an integrated circuit structure.

Future high performance integrated circuits will require interlayer dielectric (ILD) materials with as low a dielectric constant as possible. One conventional method of forming an ILD is to deposit a layer of silicon dioxide ($SiO_2$) using chemical vapor deposition (CVD) techniques. Such an ILD provides a conformal layer over the metal signal traces of an integrated circuit. Following the CVD of the $SiO_2$, a layer of planarizing glass is applied, typically using a spin-on deposition technique. The planarizing glass is then polished flat using a process known as chemical mechanical polishing. These glass layers must be carefully deposited so as to reduce the amount of residual mechanical stress. Because of the high elastic modulus of the glass, an incorrect amount of residual stress can cause severe reliability problems in the metal signal traces.

A description of the effects of stresses on the reliability of integrated circuits is given, for example, by C. T. Rosenmayer, et al., in, "EFFECT OF STRESSES ON ELECTROMIGRATION", 29th *Annual Proceedings of the IEEE International Reliability Physics Symposium*, 1991.

Several materials have been proposed for use as a low dielectric constant ILD. These materials include porous glass; fluorinated glass; a material comprising a copolymer of 2,2-bistrifluoromethyl-4,5-difluoro-1,3 dioxole (PDD) with tetrafluoroethylene (TFE); fluorinated polyimides; and fluorinated poly (benzocyclobutenes). Although these materials may operate with varying degrees of success in certain applications, they suffer from a multiplicity of shortcomings which have detracted from their usefulness. For example, these materials vary in reliability, and have long process cycles, inadequate thermal and chemical stability, and high stress. Additionally, of these listed materials, only porous glass and PDD-TFE copolymers have a dielectric constant of less than 2.2. However, porous glass is limited in practicality by its long processing time (~10 hours), while PDD-TFE copolymer has insufficient thermal stability.

Measuring the dielectric constant of thin films is difficult. More particularly, in many types of thin films, the dielectric constant is not isotropic, i.e., the dielectric constant is often lower through the thickness (z-axis) of the film than it is in-plane (xy-plane). Thus, while many reported values of low dielectric constant materials report only the through thickness result, it is the in-plane dielectric constant that is important for the application of an integrated circuit dielectric material. The xy-plane dielectric constant determines the line-to-line capacitance, which is the dominant component of capacitive delay in integrated circuits.

Typically, measurement of dielectric constant in the z-axis is performed through the use of a metal-insulator-metal (MIM) parallel plate capacitor structure. The dielectric constant is calculated by determining the capacitance of the MIM structure. For the dielectric constant to be calculated accurately, it is important that both the area of the MIM and the insulator thickness be known. Often, it is difficult to determine the precise thickness of the insulated layer. Additionally, another common technique employed to measure dielectric constant in the z-axis uses a liquid mercury probe as the upper metal surface. Use of the mercury probe is simple; however, its use is complicated by the fact that the actual mercury probe contact area is not well known. It can vary greatly since the mercury has an extremely high surface tension and does not reproducibly wet the same surface with the same contact area.

At times, the dielectric constant of material is reported as a simple square of the material's index of refraction. This type of dielectric constant measurement permits calculation of dielectric constant both in the xy-plane and the z-axis of a thin film. However, such a dielectric constant measurement is determined at optical frequencies which is significantly different from the dielectric constant of the material at typical frequencies used in electronic signal propagation. As is well known, measurement of the dielectric constant by the simple square of the index of refraction typically understates the dielectric constant by an amount equal to approximately 0.2.

The foregoing illustrates limitations known to exist in present integrated circuit structures. It is apparent that it would be advantageous to provide an improved low dielectric constant material, for use as an insulation element in an integrated circuit structure, directed to overcoming one or more of the limitations set forth above. Accordingly, a suitable alternative is provided which has a minimal dielectric constant, has thermal stability above 400° C., and possesses reasonable processing times.

SUMMARY OF THE INVENTION

The present invention provides a low dielectric constant material for use as an insulation element in an electronic device, such as but not limited to an integrated circuit structure for example. Such a low dielectric constant material may be formed from an aqueous fluoropolymer microemulsion or microdispersion. The low dielectric constant material may be made porous, further lowering its dielectric constant. The low dielectric constant material may be deposited by a spin-coating process and patterned using reactive ion etching or other suitable techniques.

In one embodiment of the present invention, an improved electronic device is provided wherein the improvement comprises a fluoropolymer dielectric material having a dielectric constant of less than 3.0, a weight loss of less than 0.15%/minute at 420° C., and a thickness of less than 5 µm.

The aqueous fluoropolymer microemulsion or microdispersion is prepared with very small cells of monomer molecules dispersed throughout an aqueous medium. The small cells each act as a polymerization site to form very small particles of polymers. The microemulsion is polymerized to produce a colloidal polymerization system containing a fluoropolymer, such as polytetrafluoroethylene (PTFE), or its copolymers. The particles have an average diameter ranging from 1 to about 80 nanometers.

In one embodiment of the present invention, the ratio of surfactant to TFE monomer necessary to produce small particles has been found to be 1.17 or more. The colloidal polymer particles may contain 20 to 100% by weight of polymerized tetrafluoroethylene and from 0 to 80% by weight of units of at least one monomer copolymerizable with tetrafluoroethylene. The co-monomers include fluorine-containing olefins of 2–18 carbons, chlorine-containing olefins of 2–18 carbons, or fully hydrogenated olefins of 2–18 carbons for example ethylene or propylene. Crosslinking agents may be present, for example, glycidylvinyl ether, chloroalkyl vinyl ether, and the like.

It has been found that different forms of polytetrafluoroethylene can be obtained depending on the ratio of components in the microemulsion. More particularly, when the ratio of surfactant to liquid TFE monomer is about 1:1, the PTFE material found is platelet-like. When the ratio of surfactant to liquid TFE monomer is greater than 1.17, small particles of PTFE are formed. Thus, ratios of surfactant to TFE monomer, by weight, of over 1.17 are beneficial in producing small, round particles of PTFE of very high molecular weight.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
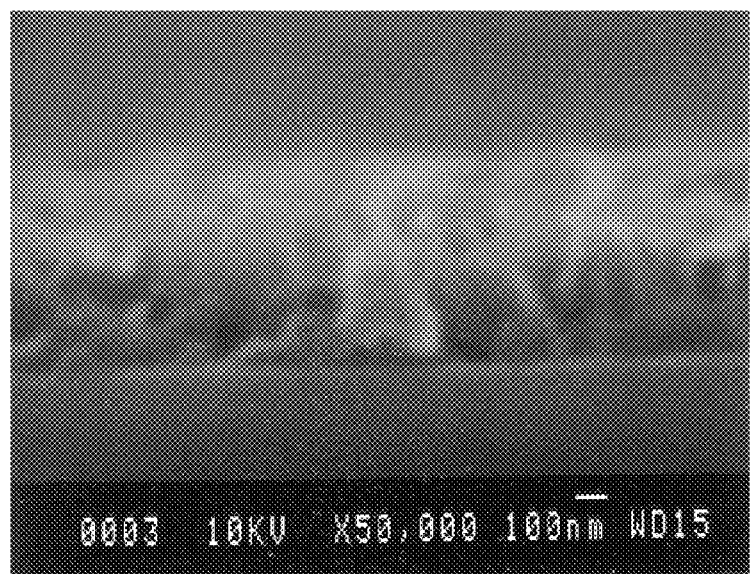
FIG. 1 is an scanning electron micrograph (SEM) cross-section of a 0.75 micron PTFE film in accordance with the teachings of the present invention.

The present invention comprises a low dielectric constant material for use as an insulation element in an electronic device, such as an integrated circuit structure. The integrated circuit structure, which may be an active or passive device, may contain one or more interlayer dielectric (ILD) layers of the low dielectric constant material of the present invention, which is formed from a fluoropolymer microemulsion or microdispersion.

As used herein, a microemulsion or microdispersion means a stable isotropic mixture of resin, oil, water, and/or surfactant which forms spontaneously upon contact of the ingredients. Other components, such as salt or a co-surfactant (such as an alcohol, amine, or other amphiphilic molecule) may also be part of the microemulsion formulation. The oil and water reside in distinct domains separated by an interfacial layer rich in surfactant. Because the domains of oil or water are so small, microemulsions appear visually transparent or translucent. Unlike emulsions, microemulsions are equilibrium phases.

Microemulsions can have several microstructures, depending upon composition, and sometimes upon temperature and pressure. There are three most common structures. One is an oil-in-water microemulsion where oil is contained inside distinct domains (droplets) in a continuous water-rich domain. The second is water-in-oil microemulsion, so-called inverse microemulsions, where water is contained inside distinct domains (droplets) in a continuous oil-rich domain. The third is a bicontinuous microemulsion where there are sample-spanning intertwined paths of both oil and water, separated from each other by a surfactant-rich sponge-like structure.

Polymerization of emulsified and microemulsified unsaturated hydrocarbon monomers is known, where high reaction rates, high conversions and high molecular weights can be achieved. A microemulsion can be distinguished from a conventional emulsion by its optical clarity, low viscosity, small domain size, thermodynamic stability and spontaneous formation. Polymerization of microemulsified monomers has many advantages over traditional polymerization of emulsified monomers. Microemulsions are normally transparent to translucent so that they are particularly suitable for photochemical reactions, while emulsions are turbid and opaque. Also, the structural diversity of microemulsions (droplets and bicontinuous) is set by thermodynamics, and rapid polymerization may be able to capture some of the original structure. In addition, microemulsion polymerization enables the production of stable, monodisperse microlatexes containing colloidal particles smaller than those produced from classical emulsion polymerization processes. Smaller particle size improves the ability to form coatings without microcracking. The increased surface area improves particle fusion during molding operations.

Emulsion polymerization, as opposed to microemulsion polymerization, of dissolved gaseous tetrafluoroethylene (PTFE) or its copolymers is a known process. Aqueous colloidal dispersions of PTFE or its copolymers can be prepared in a pressure reactor by placing the gaseous monomer, or a mixture of monomers in contact with an aqueous solution containing at least one emulsifier which generally is a fluorinated surfactant, possibly a buffer for keeping the medium at a given pH, and at least an initiator which is capable of forming free radicals at the polymerization temperature. The free radical initiators can be water soluble peroxides, or alkaline or ammonium persulfates. Persulfate can be used alone if the polymerization temperature is above approximately 50° C., or in association with a reducing agent such as ferrous salt, silver nitrate, or sodium bisulfite if the polymerization temperature is approximately between 5 to 55° C., as described in the U.S. Pat. No. 4,384,092, which is incorporated herein by reference.

The gaseous monomer molecules in the foregoing process enter the aqueous liquid and react to form polymer without first forming a distinct liquid phase. Thus, the polymer particles are large particles suspended in the aqueous mixture; and the process is not a true liquid-in-liquid emulsion polymerization. The process is sometimes referred to as dispersion polymerization.

Microemulsion polymerization operates by a different mechanism than emulsion polymerization. It involves polymerization of liquid monomer rather than gaseous monomers. Because the polymerization involves polymerization of unusually small cells of liquid monomer, the resulting polymer particles are unusually small. However, polymerization of liquid TFE is not usually practiced because of the well known potential handling hazards.

As the term is used herein "low dielectric constant" means a dielectric constant of between about 1.0 and 3.0, whereas a conventional $SiO_2$ ILD material has a dielectric constant of 3.9.

By having a dielectric constant of between 1.0 and 3.0, an ILD formed by the teachings of the present invention forms an electrically insulating layer between two electrically conducting layers, such as polysilicon or metal, which is effective in lowering the effective capacitance, reducing the crosstalk, and increasing the signal velocity of propagation (VP) of the conductive layers separated by the ILD.

As the term is used herein "fluoropolymer" means a polymer with a fully fluorinated structure. In a fully fluorinated polymer, essentially all of the hydrogen atoms are replaced by fluorine atoms.

As the term is used herein "fluorinated polymer" means a polymer with a partially fluorinated structure. In a partially fluorinated structure not all of the hydrogen atom are replaced by fluorine atoms.

The thickness of an ILD formed in accordance with the teachings herein is in a range of from about 0.1 to about 5.0 $\mu$m. More typically, the thickness is in a range of from about 0.5 to about 1.5 $\mu$m. Such a range of thicknesses may be particularly desired for producing present and future generation integrated circuit structures.

The low dielectric material of the present invention is a fluoropolymer which is deposited from a microemulsion or microdispersion comprising particles of approximately an average size of from about 1 to about 80 nanometers (0.001 to 0.080 micrometers), preferably from about 1 to about 60 nanometers, and most preferably from about 1 to about 30 nanometers; surfactant; and water. The fluoropolymer may include, but is not limited to, polytetrafluoroethylene (PTFE), fluorinated ethylenepropylene (FEP), fluoromethacrylate (Fac), or perfluoroalkoxy polymer (PFA).

The low dielectric material may have porosity induced in order to reduce its dielectric constant. The porosity may be created by employing a bicontinuous microemulsion. Such a bicontinuous fluoropolymer microemulsion system contains both oil (monomer) phase and aqueous phase intertwined into each other, separated by surfactant layers. A rapid polymerization of the monomers (oil phase) can capture the unpolymerized microstructure. When the water is removed during the drying step, a porous structure is left behind.

The low dielectric constant material of the present invention may be deposited to form an ILD by a spin coating process using a microemulsion liquid. The spin coating process is comprised of several steps which are outlined hereinafter:

1) A substrate, such as a silicone wafer for example, is spun at about 500 RPM. While the substrate is spinning at such a speed, a wefting agent, such as isopropanol, is dispensed onto the surface of the spinning substrate to wet out the surface of the substrate.

2) A fluoropolymer microemulsion is dispensed onto the surface of the spinning substrate, while it is spinning at 500 rpm.

3) The rotational speed of the substrate is next increased to a range of from about 1000 to about 5000 RPM. The rotational speed employed determines the thickness of the dielectric layer achieved, as best seen by reference to FIG. 3.

4) The increased rotational speed is maintained, until the coating thickness of the microemulsion stabilizes. Typically, stabilization occurs in from 10 to about 50 seconds, depending on the rotational speed. In this regard, a faster speed requires less time to stabilize.

5) The coated substrate is initially baked at a temperature of about 200° C. to drive off the water and surfactant of the microemulsion.

6) Thereafter, the substrate is baked at near the melting point of the fluoropolymer in order to improve its adhesion to the substrate.

7) The substrate is slowly cooled to about 200° C. by raising it above the surface of a heating device, such as a hot plate for example.

8) Finally, the substrate is cooled to an ambient temperature condition by using a chill plate.

If desired, the substrate may be planarized, imaged, and/or etched by employing conventional integrated circuit processing techniques which are known to those skilled in the art.

MICROEMULSION POLYMERIZATION PROCEDURE FOR PRODUCING SMALL PARTICLES OF POLYTETRAFLUOROETHYLENE

An aqueous microemulsion polymerization procedure produces unusually small particles of polytetrafluoroethylene (PTFE) which is particularly useful to form a low dielectric constant ILD in accordance with the teachings herein.

The ingredients, ratios and conditions of the microemulsion are selected to result in polymerization of liquid tetrafluoroethylene (TFE). In one aspect, the resulting polymers have a three-dimensional continuous micro-network of fibrils and bundles of fibrils and randomly dispersed platelets of TFE polymers. In another aspect, the resulting polymer produced is a gel characterized as a spongy mass comprised visually of layers of sheet-like configurations, and which has a microstructure of a three-dimensional continuous network of convoluted randomly disposed fibrils and bundles of fibrils of TFE polymers. In another aspect, the polymer produced is characterized as a spongy mass having a microstructure of predominantly randomly disposed platelets interconnecting or interpenetrating one another and also being randomly connected by randomly disposed fibrils, to form a three-dimensional continuous network of TFE polymer. In still another aspect, very small particles of TFE polymer are produced. Which form of polymer is produced depends on the ratio of surfactant to liquid TFE, as described above.

By microstructure, and the like, it is meant that the structure is not visible to the naked eye.

To form the polymers, a mixture of liquid tetrafluoroethylene (TFE) and at least one fluorinated surfactant in water is employed. The TFE may be introduced to the reaction vessel in liquid form, or in gaseous form and subsequently liquefied, in the presence of microemulsified seed particles, or micelles, of a liquid perfluorinated hydrocarbon that is a saturated aliphatic or aromatic organic compound having up to 2 oxygen, nitrogen, or sulfur atoms and a molecular weight preferably below 500.

PTFE produced from microemulsion polymerization when the surfactant/monomer ratio is at least 1.17 are usually small, being on the order of an average size of from 1 to 80 nanometers (0.001 to 0.080 micrometers), preferably 1 to 60 nanometers and most preferably 1 to 30 nanometers, and a polymer average molecular weight of over 100,000, preferably over 500,000 and most preferably over 1,000,000. It is believed that such unusually small polymer particles are obtained because polymerization of the gaseous TFE takes place inside the very small micelles of the hydrocarbon organic compound in the microemulsion.

The amount of surfactant used in the reaction is adjusted to maximize the formation of the type of particle desired, as described above. A suitable fluorinated surfactant or a mixture of fluorinated surfactants are needed with the weight ratio of the surfactants to monomers in the liquid phase of being adjusted according to the product desired. There is no criticality in an upper limit, but generally one usually does not go higher than 5:1. Suitable fluorinated surfactants include a fluorinated anionic surfactant, for example a salt of a fluorinated carboxylic acid or a sulfonic acid, a sulfate, a cationic surfactant for example a fluorinated quarternary ammonium salt; or a fluorinated nonionic surfactant. The mixture can be formed preferably at a temperature below the critical temperature (Tc) of TFE, approximately 33.3° C. for TFE, and above the freezing temperature of the surfactant containing aqueous solution. Mechanical stirring can be provided. Free radical polymerization can be initiated by adding water-soluble free radical initiators, for example, a peroxide, an alkaline or ammonium persulfate, or some water soluble azo compounds or a salt of permanaganate. The free radical initiators can also be used in association with a reducing agent such as ferrous salt, silver nitrate, sodium bisulfite, and the like. It is also possible to initiate the polymerization by photochemical reactions. The possible photoradiation source include ultraviolet (UV) light, electron beam, or gamma radiation. The polymerization temperature can be between 5 to 100° C., and preferably between 5 to 33.3° C. for polytetrafluoroethylene.

Comonomers that may be present in the mixture include halogenated (chlorine or fluorine) olefins of 2–18 carbon atoms, for example vinyl chloride, vinylidene chloride, chlorotrifluoroethylene, hexafluoropropylene, perfluoroalkyl vinyl ether, or the like; hydrogenated unsaturated monomers, such as ethylene, propylene, isobutylene, vinyl acetate, acrylates, or the like; crosslinking agents, such as glycidylvinylether, chloroalkyl vinyl ether, allyl-glycidylether, acrylates, methacrylates, or the like. The amount of comonomer that can be present should not be so great as to change the nature of the product that would be obtained if PTFE had been the product.

The perfluorinated hydrocarbon is a low molecular weight compound that is liquid at the temperature at which polymerization is carried out. The molecular weight is preferably less than 500. The perfluorinated hydrocarbon preferably has a boiling point less than 230° C. The perfluorinated hydrocarbon can be a perfluorinated saturated aliphatic compound such as a perfluorinated alkane; a perfluorinated aromatic compound such as perfluorinated benzene, or perfluorinated tetradecahydro phenanthene. It can also be a perfluorinated alkyl amine such as a perfluorinated trialkyl amine. It can also be a perfluorinated cyclic aliphatic, such as decalin; and preferably a heterocyclic aliphatic compound containing oxygen or sulfur in the ring, such as perfluoro-2-butyl tetrahydrofuran.

Examples of perfluorinated hydrocarbons include perfluoro-2-butyltetrahydrofuran, perfluorodecalin, perfluoromethyldecalin, perfluorodimethyldecalin, perfluoromethylcyclohexane, perfluoro(1,3-dimethylcyclohexane), perfluorodimethyldecahydronaphthalene, perfluorofluoorene, perfluoro(tetradecahydrophenanthrene), perfluorotetracosane, perfluorokerosenes, octafluoronaphthalene, oligomers of poly(chlorotrifluoroethylene), perfluoro(trialkylamine) such as perfluoro(tripropylamine), perfluoro(tributylamine), or perfluoro(tripentylamine), and octafluorotoluene, hexafluorobenzene, and commercial fluorinated solvents, such as Fluorinert FC-75 which is produced by the 3M Company. The fluorinated alkanes can be linear or branched, with a carbon atom number between 3 and 20. Oxygen, nitrogen or sulfur atoms can be present in the molecules, but the number of such atoms per molecule should be 2 or less.

The preparation of the microemulsion depends on careful selection of the ingredients. The microemulsion is prepared by mixing water, perfluorinated hydrocarbon, fluorinated surfactant(s), and optionally cosolvents or inorganic salts. The amounts employed are 0.1–40 weight percent, preferably 0.1–20, of the perfluorinated hydrocarbon; 0.1–40 weight percent, preferably 0.1–25, of the surfactant; and optionally cosurfactants; with the remainder water. The microemulsified perfluorinated hydrocarbons are believed to serve as microreactors for fluorinated monomers to enter and to be polymerized. The temperature of the microemulsion formation can be between 0 to 150° C., preferably 40 to 100° C.

The fluorinated surfactant has the structure $R_f E X$, where $R_f$ is a fluorinated alkyl group with a carbon number between 4 and 16, E is an alkylene group with a carbon number between 0 and 4, and X is an anionic salt such as COOM, $SO_3M$, $SO_3NR_2$, $SO_4M$, a cationic moiety such as quarternary ammonium salt, or an amphoteric moiety such as aminoxide, or a non-ionic moiety such as $(CH_2CH_2O)_nH$; and M is H, Li, Na, K, or $NH_4$; R is a 1 to 5 C alkyl group and n is a cardinal number of 2 to 40.

When tetrafluoroethylene is referred to herein, it is understood the term includes the so-called modified "homopolymer", in which the polymer chain includes very small amounts of units derived from perfluorol(propyl vinyl ether) or hexafluoropropylene.

To initiate polymerization, the temperature of the microemulsion is adjusted to between 0 and 150° C., preferably 40 to 100° C. Initiators for polymerization include free-radical initiators, such as persulfates, azo initiators, peroxides, or photo initiators which can generate free radicals by ultraviolet or gamma rays. Amount of initiators present can range between 0.001 to 5 percent by weight based on the final polymer content. Cosolvents such as an alcohol, amines or other amphiphilic molecules, or salt can be employed if desired to facilitate formation of the microemulsion.

Tetrafluoroethylene is introduced to the reactor from the vapor phase into the aqueous microemulsion phase. Sufficient mixing between liquid and vapor phase is important to encourage mass transfer. The mechanism of forming the ultra small polymer particles is not fully understood. It is believed that the higher the solubility of the tetrafluoroethylene monomer in the perfluorinated hydrocarbon, the better to achieve the original microemulsion particle size and shape. The time of reaction may be between 1 and 500 minutes.

The resulting polymer particles in the resulting dispersion have an average particle size of between 1 and 80 nanometers, preferably 1 to 60, most preferably 1 to 30, and a polymer average molecular weight of over 100,000, preferably over 1,000,000. The unusually small particle size provides a polymer system with a number of advantages over systems containing larger particles. The system is an aqueous colloidal dispersion, and is clear rather than turbid.

A small amount of units from comonomers may be present in the polymer, provided the amount of comonomer that can be present is not so great as to change the nature of the product that would be obtained if PTFE had been the product. In other words, the copolymer is still not melt processible. The comonomer can be a halogenated (chlorine or fluorine) olefin of 2–18 carbon atoms, for example vinyl chloride, vinylidene chloride, chlorotrifluoroethylene, hexafluoropropylene, perfluoroalkyl vinyl ether, or the like; hydrogenated unsaturated monomers, such as ethylene, propylene, isobutylene, vinyl acetate, acrylates, or the like; crosslinking agents, such as glycidylvinylether, chloroalkyl vinyl ether, allyl-glycidylether, acrylates, methacrylates, or the like.

One suitable microemulsion for use as an ILD in accordance with the teachings here had a weight ratio of surfactant to TFE liquid monomer of 330/230, i.e., well over 1.17. The resulting polymer was comprised of very small particles of PTFE, on the order of from about 0.001 to 0.06 micrometer. Such a material may be made by initially charging into a 10 liter pressure vessel, 5 Kg of deionized $H_2O$ and 330 g of ammonium perfluoroctanoate (Fluorad FC143, 3M). The pressure vessel was under vacuum and had been purged with tetrafluoroethylene gas by a vacuum repressive sequence three times. The oxygen content of the aqueous mixture was less than 20 ppm. The pressure vessel was cooled to be about 10° C. and tetrafluoroethylene gas was fed into the reactor and some tetrafluoroethylene was allowed to condense into a liquid form in aqueous phase. Total amount of liquid tetrafluoroethylene charged to the pressure vessel was about 230 g. The APFO/TFE ratio was over 1.17. The pressure vessel was equipped with a mixer and was used to stir the aqueous mixture at a speed of about 400 rpm. 2 grams of ammonium persulfate in 100 g $H_2O$ were charged to the vessel, followed by 1 gram of ferrous sulfate ($FeSO_4$) and 2 grams of sodium sulfite ($Na_2SO_3$) in 100 g $H_2O$ to initiate polymerization. The pressure inside the vessel was about 30 $Kg/cm^2$ starting from initiation to the end of about 2 hours reaction time. There was no significant pressure change throughout the reaction, which indicated that very little tetrafluoroethylene in the vapor phase participated the reaction. The temperature of the aqueous mixture inside the vessel was maintained between 10–12° C., employing brine water. After about 2 hours of reaction, tetrafluoroethylene gas was released from the vessel and the aqueous dispersion was discharged.

The aqueous dispersion looked clear, and contained about 4% polymer content. The melting temperature of the polymer was determined by Differential scan Calorimetry (DSC) to be about 331° C., which is in the melting range of polytetrafluoroethylene. The clarity of the dispersion is indicative of the presence of small particles on the order of 0.06 micrometer or less in size.

An ILD formed by a microemulsion of PTFE will have a dielectric constant of between 1.0 and 3.0.

MICROEMULSION POLYMERIZATION PROCEDURE FOR PRODUCING SMALL PARTICLES OF MELT PROCESSIBLE FLUOROPOLYMER PARTICLES

An aqueous microemulsion polymerization procedure produces unusually small particles of melt-processible fluoropolymers. During this procedure, the polymerization is carried out in the presence of microemulsified seed particles, or micelles, of a liquid perfluorinated hydrocarbon that is a saturated aliphatic or aromatic organic compound having up to two oxygen, nitrogens, or sulfur atoms and a molecular weight preferably below 500.

The polymer particles so produced are usually small, being on the order of one average size of 1 to 80 nanometers (0.001 to 0.080 micrometers), preferably 1 to 60 nanometers, and most preferably 1 to 30 nanometers. It is believed that such unusually small polymer particles are obtained because polymerization takes place inside the very small micelles of the hydrocarbon organic compound in the microemulsion.

The perfluorinated hydrocarbon is a low molecular weight compound that is liquid at the temperature at which polymerization is carried out. The molecular weight is preferably less than 500. The perfluorinated hydrocarbon preferably has a boiling point less than 230° C. The perfluorinated hydrocarbon can be a perfluorinated saturated aliphatic compound such as a perfluorinated alkane; a perfluorinated aromatic compound such as perfluorinated benzene, or perfluorinated tetradecahydro phenanthene. It can also be a perfluorinated alkyl amine such as a perfluorinated trialkyl amine. It can also be a perfluorinated cyclic aliphatic, such as decalin; and preferably a heterocyclic aliphatic compound containing oxygen or sulfur in the ring, such as perfluoro-2-butyl tetrahydrofuran.

Examples of perfluorinated hydrocarbons include perfluoro-2-butyltetrahydrofuran, perfluorodecalin, perfluoromethyldecalin, perfluorodimethyidecalin, perfluoromethylcyclohexane, perfluoro(1,3-dimethylcyclohexane), perfluorodimethyidecahydronaphthalene, perfluorofluoorene, perfluoro(tetradecahydrophenanthrene), perfluorotetracosane, perfluorokerosenes, octafluoronaphthalene, oligomers of poly (chlorotrifluoroethylene), perfluoro(trialkylamine) such as perfluoro(tripropylamine), perfluoro(tributylamine), or perfluoro(tripentylamine), and octafluorotoluene, hexafluorobenzene, and commercial fluorinated solvents, such as Fluorinert FC-75 which is produced by the 3M Company. The fluorinated alkanes can be linear or branched, with a carbon atom number between 3 and 20. Oxygen, nitrogen or sulfur atoms can be present in the molecules, but the number of such atoms per molecule should be two or less.

The preparation of the microemulsion depends on careful selection of the ingredients. The microemulsion is prepared by mixing water, perfluorinated hydrocarbon, fluorinated surfactant(s), and optionally cosolvents or inorganic salts. The amounts employed are 0.140 weight percent, preferably 0.1–20, of the perfluorinated hydrocarbon; 1–40 weight percent, preferably 0.1–25, of the surfactant; and optionally cosurfactants; with the remainder water. The microemulsified perfluorinated hydrocarbons are believed to serve as microreactors for fluorinated monomers to enter and to be polymerized. The temperature of the microemulsion formation can be between 0 to 150° C., preferably 40 to 100° C.

The fluorinated surfactant has the structure $R_f E X$, where $R_f$ is a fluorinated alkyl group with a carbon number between 4 and 16, E is an alkylene group with a carbon number between 0 and 4, and X is an anionic salt such as COOM, $SO_3M$, $SO_3NR_2$, $SO_4M$, a cationic moiety such as quarternary ammonium salt, or an amphoteric moiety such as aminoxide, or a non-ionic moiety such as $(CH_2CH_2O)_nH$; and M is H, Li, Na, K, or $NH_4$; R is a 1 to 5 C alkyl group and n is a cardinal number of 2 to 40.

The polymerizable fluorinated monomers that are other than tetrafluoroethylene, include hexafluoroethylene, perfluoro alkyl vinyl ether, trifluoroethylene, vinylidene fluoride, vinyl fluoride, chlorotrifluoroethylene. Nonfluorinated monomers can be used as comonomers, such as vinylidene chloride, vinyl chloride, ethylene, propylene, butadiene. The monomer is preferably free-radical polymerizable, and preferably is ethylenically unsaturated.

To initiate polymerization, the temperature of the microemulsion is adjusted to between 0 and 150° C., preferably 40 to 100° C. Initiators for polymerization include free-radical initiators, such as persulfates, azo initiators, peroxides, or photo initiators which can generate free radicals by ultraviolet or gamma rays. Amount of initiators present can range between 0.001 to 5 percent by weight based on the final polymer content. Cosolvents such as an alcohol, amines or other amphiphilic molecules, or salt can be employed if desired to facilitate formation of the microemulsion.

The fluorinated gaseous monomers are introduced to the reactor from the vapor phase into the aqueous microemulsion phase. Sufficient mixing between liquid and vapor phase is important to encourage mass transfer. The mechanism of forming the ultra small fluorinated melt-processible polymer particles in this invention is not fully understood. It is believed that the higher the solubility of the monomers in the perfluorinated hydrocarbon, the better to achieve the original microemulsion particle size and shape. The time of reaction may be between 1 and 500 minutes.

The resulting polymer particles in the resulting dispersion have an average particle size of between 1 and 80 nanometers, preferably 1 to 60, most preferably 1 to 30, and a polymer average molecular weight of over 100,000, preferably over 1,000,000. The unusually small particle size provides a polymer system with a number of advantages over systems containing larger particles. The system is an aqueous colloidal dispersion and is clear rather than turbid.

BICONTINUOUS MICROEMULSION POLYMERIZATION PROCEDURE FOR PRODUCING SMALL PARTICLES OF POLYTETRAFLUOROETHYLENE

One method of polymerizing liquid tetrafluoroethylene in an aqueous dispersion is described below and in U.S. Pat. Nos. 5,399,640 and 5,403,900, which are incorporated herein by reference.

The ingredients, ratios and conditions are selected to result in polymerization of liquid tetrafluoroethylene (TFE) and optionally, minor amounts of other fluorinated ethylenically-unsaturated monomers that can be present. Free radical polymerization of the monomers produces polymers of tetrafluoroethylene. The polymers have a three-dimensional continuous micro-network of fibrils and bundles of fibrils and randomly dispersed platelets.

The polymer produced is a gel characterized as a spongy mass comprised visually of layers of sheet-like configurations, and which has a microstructure of a three-dimensional continuous network of convoluted randomly disposed fibrils and bundles of fibrils. The spongy mass may also have a microstructure of predominantly randomly disposed platelets interconnecting or interpenetrating one another and also being randomly connected by randomly disposed fibrils, to form a three-dimensional continuous network.

To form such polymers, a mixture of liquid tetrafluoroethylene (TFE) monomer and at least one fluorinated surfactant in water is employed. The TFE is introduced to the reaction vessel in liquid form and the amount of surfactant used in the reaction is adjusted to maximize the formation of a bicontinuous microemulsion system. It is believed that a bicontinuous microemulsion is formed spontaneously. A suitable fluorinated surfactant or a mixture of fluorinated surfactants is needed with the weight ratio of the surfactants to all monomers of from (in the liquid phase) at least 1:10, and preferably from 1:4 or 1:2 or higher in surfactant concentration. There is no criticality in an upper limit, but generally one usually does not go higher than 5:1. The amounts of the surfactants employed are from about 0.5 to about 50 weight percent, preferably from about 1 to about 20 percent; the amounts of total monomers (in the liquid phase) are from about 0.5 to about 50 weight percent; preferably from about 1 to about 30 percent; with the remainder water and optionally some salts. Suitable fluorinated surfactants include a fluorinated anionic surfactant, for example a salt of a fluorinated carboxylic acid or a sulfonic acid, a sulfate, a cationic surfactant for example a fluorinated quartenary ammonium salt; or a fluorinated nonionic surfactant. The mixture is formed at a temperature below the critical temperature (Tc) of TFE for example approximately 33.3° C. for TFE, and above the freezing temperature of the surfactant containing aqueous solution. Pressure should be below the critical pressure of TFE (i.e. below 39 atmospheres). Mechanical stirring can be provided. Free radical polymerization can be initiated by adding water-soluble free radical initiators, for example, a peroxide, an alkaline or ammonium persulfate, or some water soluble azo compounds or a salt of permanaganate. The free radical initiators can also be used in association with a reducing agent such as ferrous salt, silver nitrate, sodium bisulfite, and the like. It is also possible to initiate the polymerization by photochemical reactions. The possible photoradiation sources include ultraviolet (UV) light, electron beam, or gamma radiation. The polymerization temperature is below the critical temperature of polytetrafluoroethylene which is about 33.3° C. A lower temperature can be any temperature above the freezing point of the mixture, but practically about 5° C. is preferred.

Comonomers that may be present in the mixture include halogenated (chlorine or fluorine) olefins of 2–18 carbon atoms, for example vinyl chloride, vinylidene chloride, chlorotrifluoroethylene, hexafluoropropylene, perfluoroalkyl vinyl ether, or the like; hydrogenated unsaturated monomers, such as ethylene, propylene, isobutylene, vinyl acetate, acrylates, or the like; crosslinking agents, such as glycidylvinylether, chloroalkyl vinyl ether, allylglycidylether, acrylates, methacrylates, or the like. The amount of comonomer that can be present should not be so great as to change the nature of the product that would be obtained if PTFE had been the product.

Free radical polymerization of the unsaturated monomers in such aqueous system can sometimes yield an aqueous medium containing colloidal fluorinated olefins having three-dimensional continuous network microstructure or can yield a spongy gel material.

Without intending to limit the scope of the present invention, the apparatus and method of production of the present invention may be better understood by referring to the following examples:

EXAMPLE 1

A 150 mm silicon wafer was spin coated with a microemulsion comprising 16% PTFE, 10% ammonium perfluorooctanoate and the balance comprised water. The average PTFE particle size was about 30 nanometers. The wafer was spun at 500 RPM, dried at 220° C. and sintered at 360° C. Film thickness was about 0.75 microns as measured by SEM in cross-section.

EXAMPLE 2

A 150 mm silicon wafer was spin coated with a microemulsion comprising 16% PTFE, 10% ammonium perfluorooctanoate, and the balance comprised water. The average PTFE particle size was about 30 nanometers. The wafer was spun at 1000 RPM, dried at 220° C. and sintered at 360° C. Film thickness ranged from about 0.38 microns to about 0.40 microns, as measured by interferometry using a refractive index of 1.38, (using a NanoSpec 210 type interferometer from the NANOMETRICS Company).

EXAMPLE 3

A 150 mm silicon wafer was spin coated with a microemulsion comprising 16% PTFE, 10% ammonium perfluorooctanoate, and the balance comprised water. The average PTFE particle size was about 30 nanometers. The wafer was spun at 2000 RPM, dried at 200° C. and sintered at 360° C. Film thickness ranged from about 0.28 microns to about 0.30 microns, as measured by interferometry using a refractive index of 1.38.

EXAMPLE 4

A 150 mm silicon wafer was spin coated with a microemulsion comprising 16% PTFE, 10% ammonium perfluorooctanoate, and the balance comprised water. The average PTFE particle size was about 30 nanometers. The wafer was spun at 3000 RPM, dried at 200° C. and sintered at 360° C. Film thickness ranged from about 0.21 microns to about 0.23 microns, as measured by interferometry using a refractive index of 1.38.

EXAMPLE 5

A 150 mm silicon wafer was spin coated with a microemulsion comprising 16% PTFE, 10% ammonium perfluorooctanoate, and the balance comprised water. The average PTFE particle size was about 30 nanometers. The wafer was spun at 5000 RPM, dried at 200° C. and sintered at 360° C. The average film thickness ranged from about 0.19 microns to about 0.22 microns, as measured by interferometry using a refractive index of 1.38.

EXAMPLE 6

A 150 mm silicon wafer was spin coated with a bicontinuous microemulsion containing 10% PTFE, 7% ammonium perfluorooctanoate, and the balance comprised water. The wafer was spun at 500 RPM, dried at 200° C., and sintered at 360° C. The resulting coating was porous by SEM observation, and had a maximum thickness of 2 microns.

Referring to the Figures FIG. 1 is an SEM cross-section of a single crystal silicon wafer which has been coated with a PTFE microemulsion, in accordance with Example 1. The wafer was prepared by cleaving after immersing in liquid nitrogen. The bottom portion of FIG. 1 is the cleaved silicon fracture surface. The middle portion of FIG. 1 is the PTFE fracture surface. It is typical of low temperature, full density PTFE fracture surfaces. By scaling from the 100 nm measurement bar, the thickness is found to be approximately 0.75 microns. The top portion of FIG. 1 is the as-deposited PTFE surface. It is visible because the view is slightly less than perpendicular to the fracture surface. The surface is very smooth, flat, and pinhole free.

Figure 2:
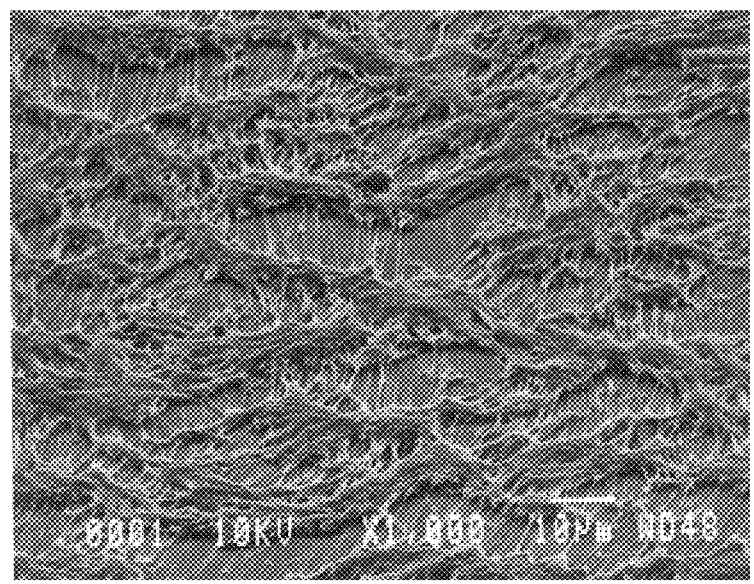
FIG. 2 is an SEM surface view of a single crystal silicon wafer which has been coated with a bicontinuous PTFE microemulsion in accordance with the teachings of the present invention.

FIG. 2 is an SEM surface view of a single crystal silicon wafer which has been coated with a bicontinuous PTFE microemulsion in accordance with Example 6. The PTFE is present in a series of full density nodes which run approximately horizontally across FIG. 6. These nodes are interconnected by PTFE fibrils which run approximately vertically across FIG. 6. The vertical direction in FIG. 6 is the same as the direction of the centrifugal force from the spinning operation. It is this force which separates the nodes, producing the fibrillation. The PTFE closely resembles conventional expanded PTFE membranes. It differs in that it was directly cast onto the surface of the wafer from the liquid microemulsion. Another method to achieve such an ILD would be to separately prepare, by a variety of extrusion and expansion processes, a PTFE membrane. This membrane would then have to be laminated onto the wafer. The teachings of the present invention eliminate many of such process steps. Also, the necessity to handle very thin membranes, which are fragile when not laminated to substrates, is eliminated by the teachings of the present invention.

Figure 3:
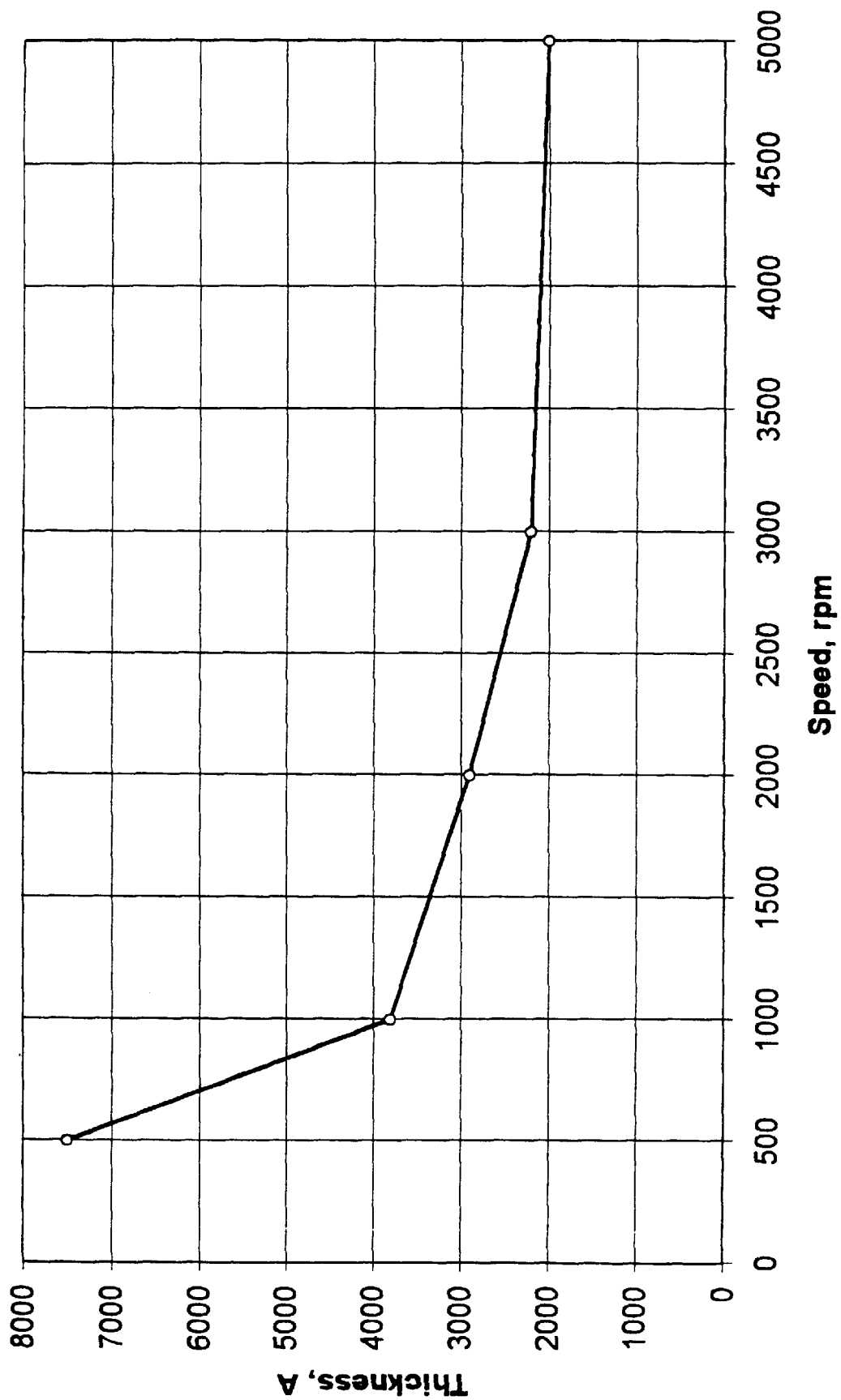
FIG. 3 is a graph of Deposited Film Thickness (Angstroms) v. Spin Speed (RPM) in accordance with the teachings of the present invention.

FIG. 3 is a graph of Deposited Film Thickness (Angstroms) v. Spin Speed (RPM) in accordance with the teachings of the present invention. It may be seen that thickness decreases smoothly with increasing rotational speed. This allows a variety of coating thicknesses in the range of from about 0.75 microns to about 0.2 microns to be easily deposited onto a substrate in accordance with the teachings herein.

Figure 4:
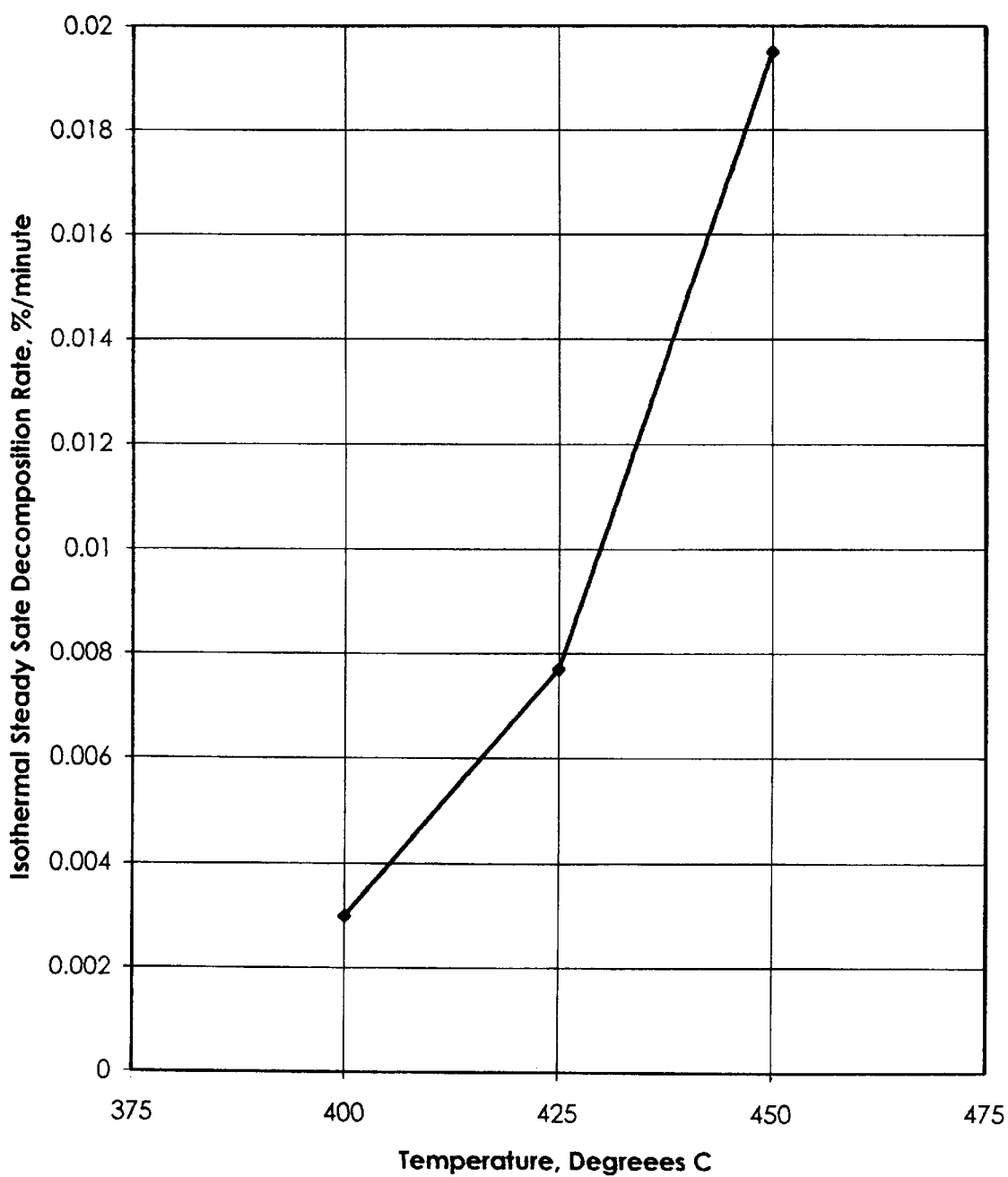
FIG. 4 is a graph of Isothermal Weight Loss Rate (%/minute) v. Temperature.

FIG. 4 is a graph of Isothermal Weight Loss Rate (%/minute) v. Temperature. This graph illustrates that the low dielectric material of the present invention is particularly useful as a dielectric material for an integrated circuit structure because of the low weight loss rates experienced by this material at the high temperatures which are required in the manufacture and processing of integrated circuit structures.

Thermal decomposition may be determined using any suitable conventional method. For example, thermal decomposition rate may be determined using a thermo-gravimetric analyzer (TGA) Model 2950 from TA Instruments, Inc. (New Castle, Del.). A 50 mL sample of the microemulsion is placed in the 100 mL sample pan of the TGA. The sample pan is tared by the TGA prior to sample introduction. The majority of the solvent is allowed to evaporate at room temperature. This requires about two hours. Alternatively, the sample drying can be accelerated by placing the sample pan on a hot plate controlled at 80° C. to 90° C. to avoid spattering the sample out of the pan by evaporating the liquid too rapidly. The sample and pan are cooled to room temperature. The sample is loaded into the TGA. (The instrument automatically hangs the pan from the hang-down wire of the balance.) The furnace is closed and the thermal method is started. The furnace and balance chamber are purged with dry nitrogen gas for at least two hours prior to running the first sample. The purge rate through the furnace is 60 mL/min and the balance chamber is 40 mL/min. It is important that such nitrogen purging be accomplished with "dry" nitrogen, such as is obtained by passing the nitrogen gas though a DRIERITE® column prior to entering the TGA. (DRIERITE® is a registered trademark of W. A. Hammond Drierite Company.) As should be understood, nitrogen gas which has been taken from the boil-off of a liquid nitrogen tank is not dry enough for this test. It must still be passed through the DRIERITE® column prior to entering the TGA. The thermal method consists of: 1) heating the sample at 7.5° C./min, resolution=4.0, to 250° C.; 2) holding isothermal at 250° C. for 30 mins; 3) heating at 7.5° C./min, resolution=4.0, to 400° C.; and 4) holding isothermal at 400° C. for 120 mins. The data is analyzed by plotting only the last isotherm of the method as percent weight on the Y-axis and time (in minutes) on the X-axis. The percent weight at the start of this isothermal is adjusted to be 100 percent. This corrects for any residual solvent that may have been left in the sample after the initial drying step. Determining the curve value at the end of the isothermal curve (point 1) and sixty minutes prior to the end of the curve (point 2). Subtract the percent weight of point 1 from point 2 to obtain the percent weight loss per hour.

The following method may be employed to determine the xy-plane dielectric constant of an integrated circuit dielectric element of the present invention.

A base substrate, such as silicon or a silicon dioxide, is metallized typically with aluminum or copper by sputtering, MOCVD, or electroplating. The metallized substrate is then coated with a dielectric material. A typical coating thickness is approximately 1 micron, although other thicknesses can be used provided they do not demonstrate a change in critical properties, such as isotropy. A small portion of the metallized substrate is masked off prior to dielectric deposition to permit contacting the metallized substrate surface during testing. Following deposition of the dielectric layer, another metallic layer with a simple pattern is deposited on top of the dielectric material. A 1 cm×1 cm square pattern is masked on the dielectric material through the use of a tape such as polyimide tape. Once the 1 cm×1 cm area is defined with the tape, the substrate is then metallized again with a similar process such as sputtering or MOCVD or electroplating.

After metallization, the polyamid tape is removed from the dielectric in order to leave behind a 1 cm×1 cm metallization on the top surface of the wafer. The capacitance between the 1 cm×1 cm top layer of metal on the base substrate is then measured through the use of an instrument, such as a Hewlett-Packard Model 4284 LCR meter. The precise film thickness is then determined by a scanning electron microscopy cross-section photomicrograph, unless other more accurate and verified methods can be shown for the dielectric material being tested. The dielectric constant is then calculated from the measured capacitance and thickness of the sample. This determines the dielectric constant in the z-axis.

Next, the xy-plane and z-axis index of refraction is measured through the use of a prism coupler, such as that manufactured by Metrocon, Inc. The index of refraction in the z-xis and the xy-plane are then both squared. The squared number for the xy-plane index of refraction is then subtracted from the square of the index of refraction for the z-axis. This difference is then subtracted from the previously calculated value for the dielectric constant of the z-axis direction to determine the dielectric constant of the xy-plane.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

What is claimed is:

1. An article comprising:

a substrate having an integrated circuit structure; and a dielectric for insulating conductive elements of said integrated circuit structure, said dielectric being a fluoropolymer material having a weight loss in a range from about 0.002%/minute to less than 0.15%/minute at 420° C., a thickness of less than 5 μm, and a dielectric constant of less than 2.2.

2. An article comprising:

a substrate having an integrated circuit structure; and a dielectric for insulating conductive elements of said integrated circuit structure, said dielectric being a fluorinated material having a weight loss in a range from about 0.002%/minute to less than 0.15%/minute at 420° C., a thickness of less than 5 μm, and a dielectric constant of less than 2.2.

3. The article of claims 1 or 2, wherein the dielectric has a dielectric constant in a range from about 1.3 to less than 2.2.

4. The article of claims 1 or 2, wherein the thickness of the dielectric is less than 1.5 μm.

5. The article of claims 1 or 2, wherein the weight loss of the dielectric is less than 0.02%/minute at 420° C.

6. The article of claims 1 or 2, wherein the weight loss of the dielectric is less than 0.01%/minute at 420° C.

7. The article of claim 1, wherein the fluoropolymer is a homopolymer of tetrafluoroethylene.

8. The article of claim 1, wherein the fluoropolymer is a copolymer of tetrafluoroethylene.

9. The article of claim 1, wherein the fluoropolymer includes comonomers selected from a group consisting of hexafluoropropylene and perfluoro (alkyl vinyl ether).

10. The article of claim 1, wherein the fluoropolymer further includes antioxidants.

11. The article of claim 1, wherein the fluoropolymer further includes silicon dioxide.

12. The article of claim 1, wherein the fluoropolymer is porous.

13. A method of insulating a substrate having an integrated circuit structure, said method comprising the following steps:

providing a substrate having an integrated circuit structure having conductive elements;

providing a dielectric for insulating said conductive elements of said integrated circuit structure, said dielectric being a fluoropolymer or a fluorinated material having a weight loss in a range from about 0.002% minute to less than 0.15%/minute at 420° C., a thickness of less than 5 μm, and a dielectric constant of less than 2.2;

depositing a volume of said dielectric on a surface of said substrate;

spinning said substrate;

baking said substrate at a temperature of about 200° C.; and sintering said substrate.

* * * * *